United States Patent [19]

Kaminski

[11] 4,224,582

[45] Sep. 23, 1980

[54] COMMUTATING CAPACITIVE ENVELOPE DETECTOR

[75] Inventor: William Kaminski, West Portal, N.J.

[73] Assignee: Bell Telephone Laboratories, Incorporated, Murray Hill, N.J.

[21] Appl. No.: 952,837

[22] Filed: Oct. 19, 1978

[51] Int. Cl.² .................. H03H 7/10; H03H 7/14
[52] U.S. Cl. ........................ 333/173; 328/167; 333/20
[58] Field of Search ............ 333/173, 20; 328/165, 328/151, 167; 307/246; 329/50

[56] References Cited

U.S. PATENT DOCUMENTS

| | | | |
|---|---|---|---|
| 1,626,634 | 5/1927 | Slepian | 333/173 X |
| 3,403,345 | 9/1968 | Frank et al. | 328/165 |
| 3,729,695 | 4/1973 | Condon | 333/173 |
| 3,758,884 | 9/1973 | Bahler et al. | 333/173 |
| 3,795,877 | 3/1974 | Poole | 333/173 |

Primary Examiner—Marvin L. Nussbaum
Attorney, Agent, or Firm—Roy C. Lipton

[57] ABSTRACT

The peak output of a commutating capacitor triplet device (201) which contains three capacitors (10, 11, 12) connected in pairs across an input signal to provide six samples of each signal cycle, is obtained to provide envelope detection. To reduce output ripple by increasing the number of samplings of each cycle without increasing the number of capacitors, a portion of the output is obtained at the junction (13) of the capacitors, the amplitudes of the output and portion thereof are weighted with respect to each other by resistors (204, 205) and combined. In one embodiment, the positive and negative parts of the combined signal are applied to a full wave rectifier (207, 208, 214). In another embodiment, the positive and negative parts of the portion are inversely combined (306, 307, 308) prior to the portion being combined with the output of the triplet device.

11 Claims, 7 Drawing Figures

CCT RESONATOR

CCT STATES A THRU F

DETECTOR CIRCUIT

DETECTOR CIRCUIT

COMMUTATING CAPACITIVE ENVELOPE DETECTOR

TECHNICAL FIELD

This invention relates to filters utilizing commutating capacitors such as commutating capacitor triplet devices.

BACKGROUND OF THE INVENTION

Commutating capacitor devices constitute pluralities of capacitors which are connectable, in sequence, in series with or in shunt across a signal path to simulate the impedance effect of filters in the band-rejection or bandpass mode. One such device, called a commutating capacitor triplet, and described in U.S. Pat. No. 3,729,695, issued to J. H. Condon on Apr. 24, 1973, contains three capacitors which, during each cycle of the input wave, are connected in pairs to create six sequential states. Each capacitor pair is series connected across the input wave and is charged by the input wave (and the wave is thus sampled) at a particular phase of each wave cycle at an instant of time which is separated by 60 degrees from the next prior and from the next subsequent sampling.

Prior art patents disclosing commutating capacitive devices include U.S. Pat. No. 3,403,345 issued Sept. 24, 1968 to R. L. Frank and A. H. Phillips, U.S. Pat. No. 3,758,884 issued Sept. 11, 1973 to L. G. Bahler and J. H. Condon and U.S. Pat. No. 3,795,877 issued Mar. 5, 1974 to M. A. Poole.

The Frank et al patent discloses two series connected commutating capacitive devices wherein one device is driven substantially in phase with and the other substantially in phase quadrature with certain input signal components. The output of these series devices is subtractively combined with an attenuated portion of the input signal to substantially eliminate the above-mentioned signal components.

The Bahler et al patent discloses a band-rejection filter which comprises a plurality of commutating capacitive devices connected in parallel and driven in different phases with respect to one another wherein the outputs are additively combined.

The Poole patent discloses a notch filter comprising a first commutating capacitive device series connected with a second commutating capacitive device wherein the series output is fed back to the output of the first device in the series.

A useful implementation utilizing a commutating capacitor device might be a peak or envelope detection arrangement. The capacitor device is placed across the input signal and thus arranged in the bandpass mode. One sampling state of the input wave occurs at or near the signal peak of the wave cycle and, assuming that the commutator control signal frequency is the same as the input signal frequency, subsequent samplings in the corresponding state occur at the same place of subsequent input wave cycles whereby a relatively fixed charge of the signal peak samplings is obtained for that one state. Peak detection of the various states then indicates the charge of this one state as being the signal peak.

In the event that the frequency (and phase of the input signal) should drift with respect to the control signal, corresponding samplings shift in phase and the amplitude of each of the charges is thus shifted. Successive ones of the peaks of the input wave may, or may not, be sampled, because different phases of the input signal are being sampled. Thus different peak signal amplitudes of the wave cycles are sampled and a peak detection of the various samples result in a ripple output. A reduction of envelope or peak detection ripple might be accomplished by increasing the samplings per wave cycle to reduce the phase angle between samples. This, however, normally requires an increase in the number of capacitors.

It is the object of this invention to reduce output ripple without increasing the number of capacitors.

SUMMARY OF THE INVENTION

In accordance with this invention, a portion of the capacitive charge is obtained in the interval between the cycle phase at which the wave is sampled and an adjacent (subsequent or prior) cycle phase at which the wave is sampled. The capacitive charge and the portion thereof are then combined. More specifically, the portion charge is obtained at the midpoint of the adjacent interval. The capacitive charge and the portion thereof are then weighted with respect to each other to equalize their peak amplitudes and then combined. Obtaining the charge portion during the adjacent (subsequent and prior) intervals and combining the portion with the capacitive charge results in increasing the number of "samplings" without requiring additional capacitors. Obtaining the portion charge and the interval midpoint and weighting the charges to equalize peaks results in "samplings" separated by fixed and equal phase angles.

In specific embodiments of this invention disclosed hereinafter a portion of the charge across a capacitor pair in a triplet device is obtained at the junction of the pair to thereby sense the charge across one capacitor in the pair. It is shown by analysis that, in the triplet device, this sensing occurs at the midpoint (in time) of adjacent sensings (involving the one capacitor) and provides three "midpoint" samplings (in addition to the six sampling states).

In one of the specific embodiments, positive and negative portions of the junction charges are inversely combined to increase the three samplings to six equivalent samplings. These six samplings are then combined with the original six samplings (after appropriate weighting) to thereby, in effect, double the total number of samplings.

In another one of the specific embodiments, the original and junction charges (appropriately weighted) are combined and the positive and negative portions are full wave rectified to double the number of samplings.

The foregoing and other objects and features of this invention will be more fully understood from the following description of illustrative embodiments taken in conjunction with the accompanying drawings.

DETAILED DESCRIPTION

Figure 1:
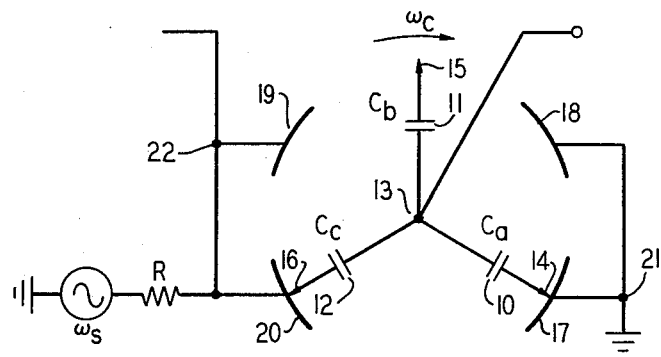
FIG. 1 discloses a commutating capacitor triplet device modified to provide a junction charge in accordance with this invention.

FIG. 1 shows a typical commutating capacitor triplet (CCT) device made up of three capacitors 10, 11 and 12 of equal capacitance arranged in a star or Y configuration. One side of each of the three capacitors is interconnected to a common junction point or terminal 13. The other side of capacitors 10, 11 and 12 are connected to junction points or terminals 14, 15 and 16, respectively. These three junction points are connectable, in sequence, to four commutating switch segments 17–20.

Segments 17 and 18 are coupled together to common junction point or terminal 21 and segments 19 and 20 are coupled together to common junction point or terminal 22. The circular arrangement of segments 17–20 is intended to indicate schematically that, when the Y configuration of capacitors 10–12 is rotated clockwise, for example, by mechanical, electro-mechanical, electronic or other means (not shown) under control of a commutator control signal, each of terminal points 14–16 sequentially contact or connect to segments 17–20, contacting each segment for one-sixth of a period or 60 degrees of each of the commutating control signal cycles. This results in six states (shown in FIGS. 2A–2F) for each period of the commutating control signal (or for each rotation of the capacitor configuration) wherein, in each state, a pair of capacitors 10–12 is connected across terminals 21 and 22.

As shown in FIG. 1, an input signal is applied to terminal 22. Ground is applied to terminal 21. Accordingly, the pairs of capacitors connected across terminals 21 and 22 are thus charged by the current source applied to terminal 22 and, more particularly, during each 60 degree interval that the capacitor pair is connected across the signal source, the pair accumulates a charge which is the average voltage level of that input signal during the 60 degree period. As described in the above-identified Condon patent, this arrangement constitutes a two-terminal device which simulates the impedance effects of a filter, and operates in a bandpass mode when connected in shunt across a signal path.

Figure 2:
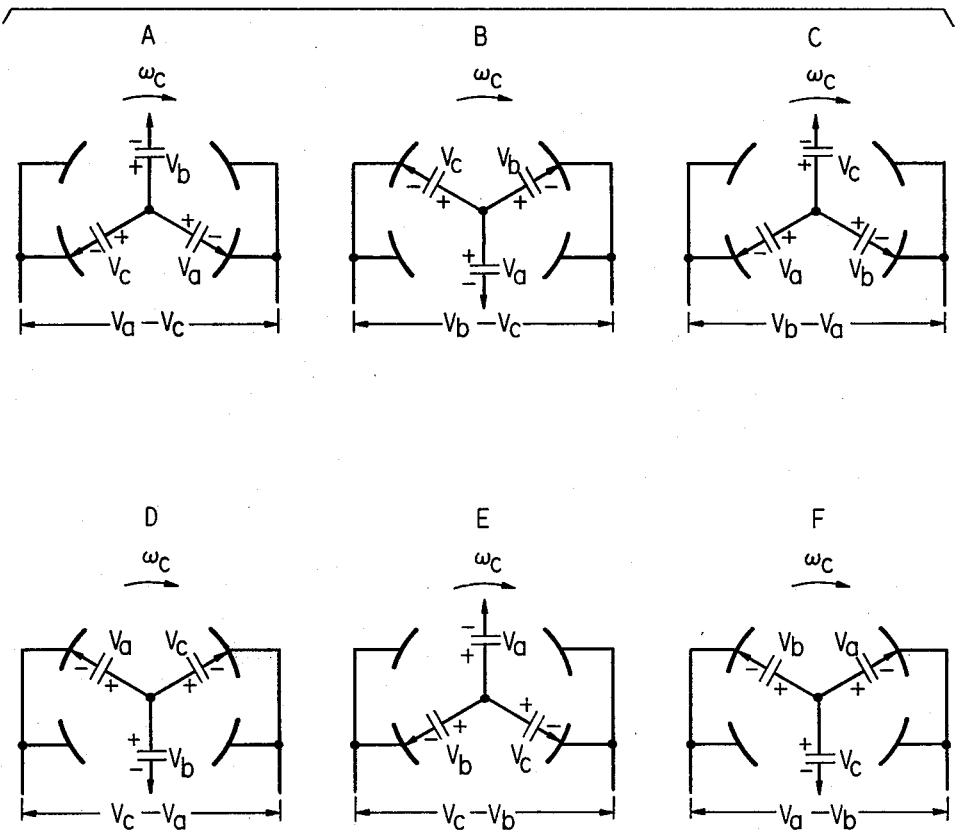
FIG. 2A-F show a schematic representation of the six states of the commutating capacitor triplet device.
Figure 3:
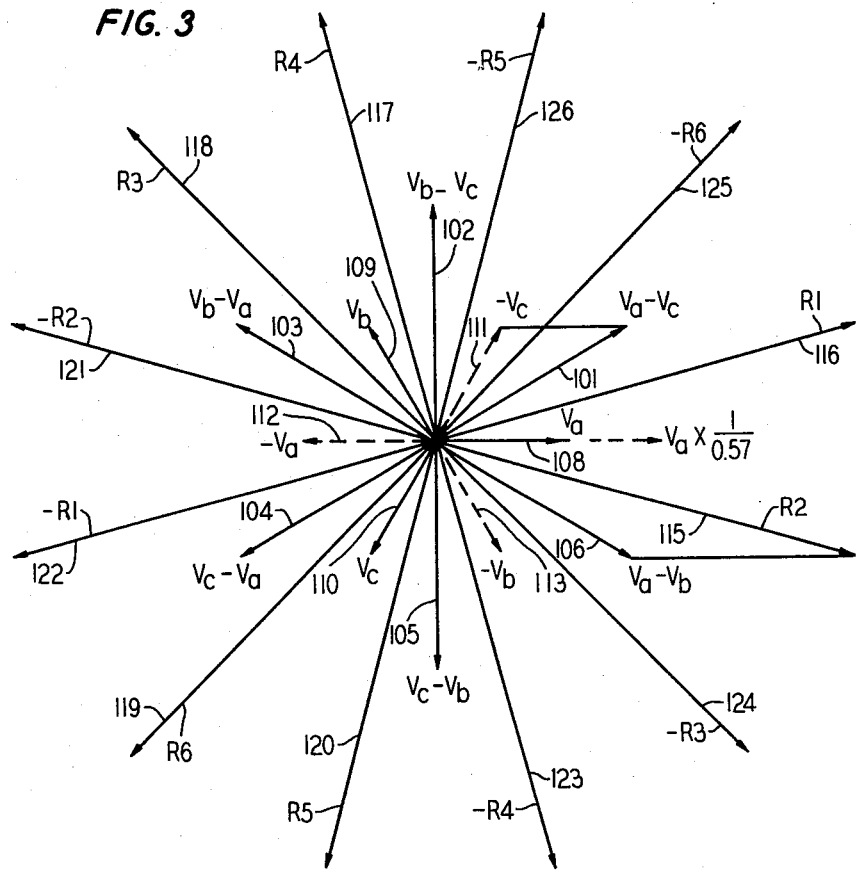
FIG. 3 represents a vector analysis of the samplings obtained by the capacitors.

If the input signal has the same frequency as the commutator control signal (that is, the period of each cycle of the input signal coincides with the period of the CCT rotation), then each of the six states shown in FIGS. 2A–2F occurs during the same 60 degree phase period of the input signal cycles. This is depicted in FIG. 3 by phase vectors 101 to 106 which define the voltages and phases of the input signal sampled by the capacitive pairs. For example, in state A as shown in FIG. 2A, the sample voltage constitutes the sum $V_a - V_c$, where $V_a$ is the voltage charge across the capacitor connected to terminal 14, for example, and $V_c$ comprises the charge across the capacitor connected to terminal 16, for example. The sum of these voltages then constitutes the phase vector 101 in FIG. 3 and phase vector 101 remains constant in amplitude and phase so long as the input signal frequency and the commutator control signal frequency remain equal. Similarly, under this circumstance, the phase vectors 102 to 106 depicting the voltage samples in states B–F, as shown in FIGS. 2A–2F, also remain constant in amplitude and phase.

Figure 6:
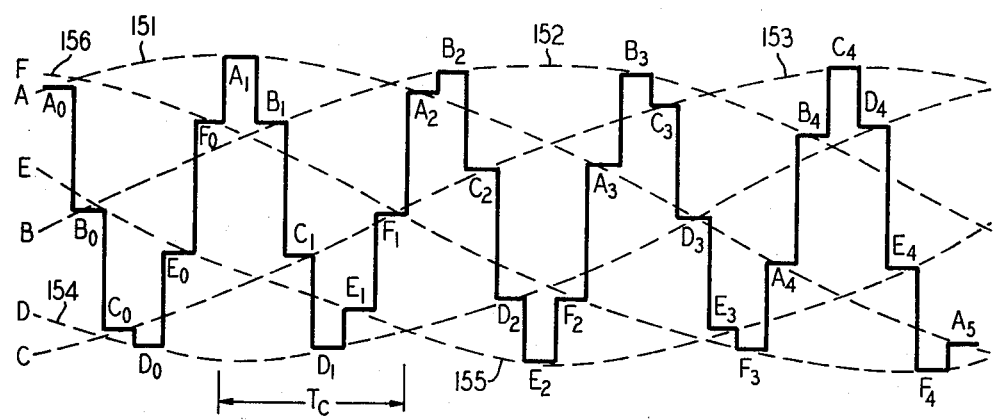
FIG. 6 and FIG. 7 show waveforms defining loci of points representing samplings of the triplet device.

In the event that the input signal should drift in phase with respect to the commutator control signal, the sampling of the input signal during any one of the states correspondingly shift in phase (and amplitude). FIG. 6 depicts the voltages sampled during each state by the capacitor pairs when such phase drifting occurs, which samplings of the input waves is represented by the staircase wave thus formed by samplings A to F. Thus, it can be seen, for example, that during state A the samplings designated as $A_0$, $A_1$, $A_2$, $A_3$, $A_4$, $A_5$ all occur during different phases of the input signal (and thus have different amplitudes).

These samplings in state A thereby form a set of loci 151 having a wave configuration wherein, assuming that one sampling, such as sampling $A_1$ is at the peak amplitude of the input wave, other samplings $A_0$ and $A_2$ to $A_5$, et cetera, occur at other phases and thus other amplitudes of the input signal. Similarly, samplings in each of the other states, B to F, occur during different phases of the input signal to form other sets of loci 152 and 156 and wherein these samplings may, or may not, sample peaks of the input wave (other than the peak sampled by sampling $A_1$). As a consequence of the input wave being sampled at different phases, wherein its peak may, or may not be sampled, different maximum input signal amplitudes are sampled and a peak detection of such samplings results in a ripple output.

One way of reducing envelope ripple would be to increase the number of sampling states of the CFT to reduce the phase angle between samplings, but this requires an increase in the number of capacitors. In accordance with this invention, however, additional samplings are available from portions of the charges that are developed across the capacitor pairs. For example, as seen in FIG. 1, three additional samplings are available by obtaining from terminal 13 the charges on individual capacitors 10, 11 and 12.

It can be shown by trigonometric proof and vector analysis that the six voltages formed during each commutator cycles by the capacitor pair samplings are separated by intervals of 60 degrees of the commutator control signal and that the three voltages formed during each commutator cycle by the individual capacitors are separated by intervals of 120 degrees and displaced by 30 degrees relative to voltages formed by the pairs. This is represented in FIG. 3 which shows the vectors 108 to 110 which depict the charges obtained from the individual capacitors at 0, 120 and 240 degrees of the control signal. It should be noted that the inverse of these voltages (which are produced by capacitor pairs when the CCT has been rotated 180 degrees) are shown as vectors 111 to 113 at 60, 180 and 300 degrees. FIG. 3 also shows vectors 101 to 106 at 30, 90, 150, 210, 270 and 330 degrees. A vector analysis of vectors 108, 113 and 106 discloses how the phasor 108 voltage $V_a$ and the phasor 109 voltage $V_b$ on the individual capacitors are combined to form the phasor 106 which depicts $V_a - V_b$ sampled in state F. It should also be noted that each phasor 101 to 106 is equal and opposite (inverse) to another one of phasors 101 to 106; such as phasor 104 being equal and inverse to phasor 101.

Additional samplings are provided by combining the samplings derived from a state, such as state F sampling $V_a - V_b$, with the sampling derived from an individual capacitor, such as sampling $V_a$. An embodiment for combining the samplings is shown in the peak envelope detector depicted in FIG. 4. The input signal 202 is provided to one terminal of CCT device 201 which corresponds to junction point 22. One output is thereby derived at junction point 22 across CCT device 201, as previously described, which output is the voltage sampled during each state, such as voltage $V_a-V_b$. The other terminal of CCT device 201 is the terminal connected to junction point 13. The sampled voltage on junction point 22 and the sampled voltage on junction point 13 are additively combined by passing these voltages through resistors 204 and 205, respectively, to a common input terminal of amplifier 206. The output of amplifier 206 thus provides the additive combination of the two sampled voltages derived from terminals 13 and 22.

Referring again in FIG. 3 and reexamining the vector analysis which forms the voltage $V_a-V_b$, it can be shown that the amplitude quantity of $V_a-V_b$ is the square root of 3 times greater than the quantity of $V_a$ alone, assuming each capacitor is charged to a voltage of "unity". To provide equal angles between the several newly derived additive combination samples (which constitute the combination of the capacitor pair samples and single capacitor samples), it is desirable that the two samples which form each of these new additive combinations are equal in amplitude. To accomplish this result, it is necessary to multiply the voltage $V_a$ of the single capacitor sample by the square root of 3 (or divide the $V_a-V_b$ voltage of the capacitive pair by the square root of 3). The resulting vector representing the additive combination of two vectors thus weighted would result in a third vector, such as vector 115, and vector 115 is invariably at the midpoint of the angle formed by weighted vectors 106 and 108 and thus 15 degrees from these latter two vectors.

Similarly, other vectors, namely vectors 116 to 120 are obtained by additively combining weighted vectors representing individual capacitor samplings and capacitor pair samplings. It is to be noted that the six vectors 115 to 120 do not have inverse vectors, that is, that vectors 180 degrees out of phase with vectors 115 to 120 have not been formed by the additive combination. Accordingly, by inverting vectors 115 to 120 and by thereby forming vectors "equal and opposite" to vectors 115 to 120, a total to twelve vectors (or samplings) are obtained resulting in twice the samplings (or half the difference in phase angle) and the consequent reduction in ripple. These equal and opposite vectors are represented by vectors 121 to 126 in FIG. 3 and the manner they are obtained is described below.

Figure 4:
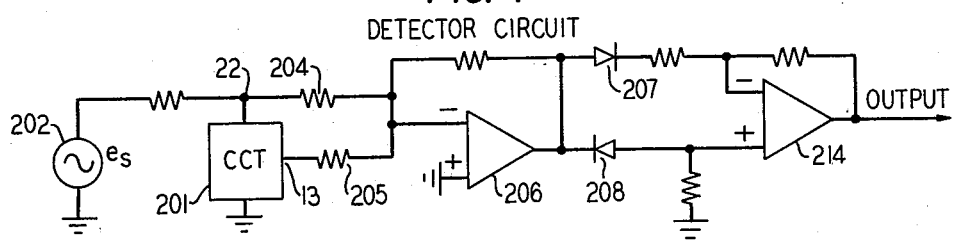
FIG. 4 depicts, in schematic form, one embodiment of an envelope detector in accordance with this invention.

An embodiment resulting in vectors 115 to 120 is accomplished in the detector circuit in FIG. 4 by arranging the resistance of resistor 204. The voltage on junction point 22 is thereby relatively decreased (or the voltage on junction 13 is relatively increased) whereby the peak amplitudes of the two voltages provided to amplifier 206 are substantially equal. The resultant voltage is combined by application to the common input of amplifier 206, whose output represents the vectors 115 to 120.

The output of amplifier 206 is applied to diodes 207 and 208 which pass the rectified output to the differential input of amplifier 214. This results in the full wave rectification of the amplifier 206 output. The inverting of the samplings provides the inverse (equal and opposite) vector. The output of amplifier 214 thus provides the additive combinations, depicted as vectors 115 to 120, and the inverse of the additive combinations, depicted as vectors 121 to 126.

Figure 7:
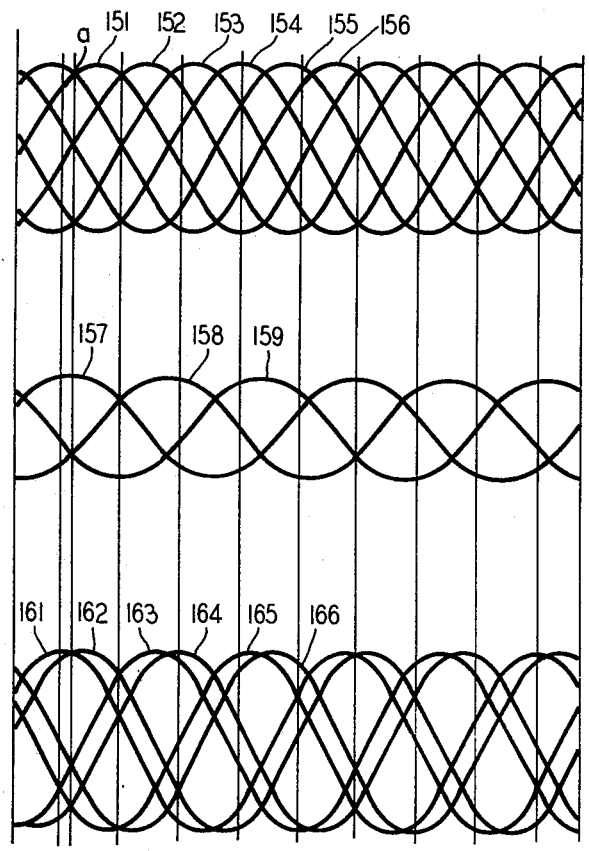

Referring to FIG. 7, waveforms 151 to 156 show the six distinct loci formed by the capacitor pair samplings in the six states A-F when there is a difference in frequency between the input signal and the commutator control signal. The waveforms 151 to 156 are a compressed version of the loci waveforms 151 to 156 shown in FIG. 6.

Waveforms 157 to 159 depict three distinct waveforms which define the loci of the samplings of the three individual capacitors. Since it is presumed that there is a difference in frequency between the commutator control signal and the input signal, samplings of each capacitor occur at different phases of the input signal and successive samplings thus differ in amplitude whereby the loci of samplings of any one capacitor forms the sine like waveform, such as any one of waveforms 157 to 159. As described above, these samplings (depicted by the loci of sampling waveforms 157 to 159) are obtained at terminal 13 of CCT device 201.

When the samplings at terminals 13 and 22 are appropriately weighted by resistors 204 and 205 in FIG. 4 and combined by amplifier 206, they provide six distinct loci of samples depicted as waveforms 161 to 166. Thus, the samplings making up waveforms 161 to 166 correspond to the previously described weighted and additively combined samplings shown as vectors 115-120 in FIG. 3. Waveforms 161 to 166, it is to be noted, are asymmetrical; (as vectors 115 to 120 do not have formed inverse vectors) so that the positive portion of each of waveforms 161 to 166 do not have a corresponding inverse waveform.

The full wave rectification of the output of amplifier 206 by diodes 207 and 208 and amplifier 214 inverts each negative combined sampling at the output of amplifier 206, which samplings form the negative or lower portions of each of waveforms 161 and 166 and combines these samplings with the positive samplings which form the upper portions of each of waveforms 161 to 166. Since the waveforms are asymmetrical, this results in twice the waveforms, or 12 waveforms defining the loci of 12 samplings of the input wave. The consequent doubling of the number of samplings (without increasing the number of capacitors) decreases the ripple of the peak detected output.

Figure 5:
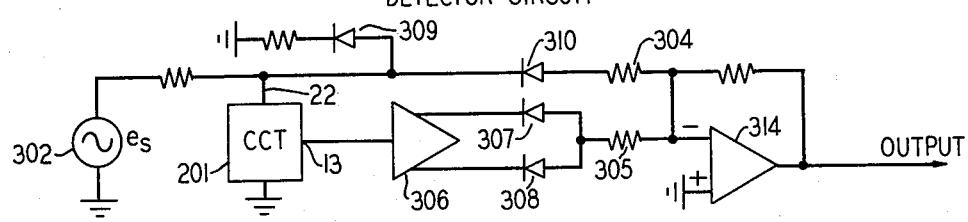
FIG. 5 depicts another embodiment of an envelope detector.

FIG. 5 discloses an alternate detector circuit arrangement with input signal 302 being applied to junction point 22 of CCT device 201. The resultant sampled voltages at junction point 22 are rectified by diodes 309 and 310 and applied by way of resistor 304 to the negative input of amplifier 314. At the same time, the sampled voltages at junction point 13 of CCT device 201 are applied to amplifier 306. The positive and negative outputs of amplifier 306 are passed through diodes 307 and 308 and the wave and thus fully rectified are applied through resistor 305 to the same input of amplifier 314 as the rectified wave from junction 22. The rectified wave from junction point 13, however, is weighted by resistor 305 with respect to the wave derived at junction point 22 by a factor of the square root of 3. These waves thus weighted and additively combined are then passed through amplifier 314 to provide an output corresponding to the output of the detector circuit in FIG. 4.

Although a specific embodiment of this invention has been shown and described, it will be understood that various modifications may be made without departing from the spirit of this invention.

I claim:

1. A filter for an input wave comprising:
   n capacitances (10, 11, 12), and
   means (14, 15, 16, 17, 18, 19, 20, 22) for applying each of the capacitances across the input wave at one of n equally spaced points of each wave cycle and for obtaining from each capacitance concurrently with the application the resultant capacitance charge, characterized by means (13) for obtaining a portion of the capacitance charge during the spacing between the corresponding point and an adjacent point, and means (204, 205, 206) for combining the capacitance charge and the portion thereof.

2. A filter for an input wave in accordance with claim 1 wherein the means for obtaining obtains the portion charge at the midpoint of the spacing between the points.

3. A filter for an input wave in accordance with claim 1 wherein the means for combining includes means (204, 205) for weighting the capacitance charge and the portion thereof with respect to each other.

4. A filter for an input wave in accordance with claim 3 wherein the weighting means is arranged to weight the charges to equalize the peak amplitudes thereof.

5. A filter for an input wave in accordance with claim 1 and further including means (207, 208, 214) for inversely combining positive and negative parts of the portion charge.

6. A filter for an input wave in accordance with claim 5 wherein the means for inversely combining includes means for inverting one of the positive and the negative parts 7. A filter for an input wave in accordance with claim 5 wherein the means for inversely combining includes means for rectifying the positive and negative parts of the portion charge.

8. A filter for an input wave in accordance with claim 7 wherein the means for rectifying includes means for differentially combining the positive and negative rectified parts.

9. A filter having an input wave comprising:

means for connecting different pairs of capacitors across the input wave at equally spaced points of each wave cycle, and means for obtaining the resultant charge across each pair at the corresponding point, characterized by means for obtaining a charge from the junction of each capacitor pair during the spacing between the points, and means for combining the junction charges and the capacitive pair charges.

10. A filter in accordance with claim 9 wherein the means for combining includes means for weighting the capacitive pair charges and the junction charges with respect to each other to equalize the peak amplitudes thereof.

11. A filter in accordance with claim 9 wherein the means for combining includes means for inversely combining positive and negative parts of the junction charges.

* * * * *